(12) United States Patent
Chen et al.

(10) Patent No.: US 7,829,388 B2
(45) Date of Patent: Nov. 9, 2010

(54) INTEGRATED CIRCUIT PACKAGE AND FABRICATING METHOD THEREOF

(75) Inventors: Chin-Yung Chen, Taoyuan County (TW); Chia-Hung Hsu, Taipei County (TW); William Wang, Taoyuan County (TW); Chung-Cheng Chou, Taoyuan County (TW)

(73) Assignee: Raydium Semiconductor Corporation, Hsinchu (TW)

( * ) Notice: Subject to any disclaimer, the term of this patent is extended or adjusted under 35 U.S.C. 154(b) by 0 days.

(21) Appl. No.: 12/694,239

(22) Filed: Jan. 26, 2010

(65) Prior Publication Data

US 2010/0129963 A1 May 27, 2010

Related U.S. Application Data

(62) Division of application No. 12/102,439, filed on Apr. 14, 2008.

(30) Foreign Application Priority Data

Jan. 16, 2008 (TW) ............................... 97101614 A

(51) Int. Cl.
*H01L 21/00* (2006.01)

(52) U.S. Cl. ........................................ 438/122; 438/106
(58) Field of Classification Search ................. 438/122, 438/106
See application file for complete search history.

(56) References Cited

U.S. PATENT DOCUMENTS

| 6,201,300 | B1 * | 3/2001 | Tseng et al. ................. 257/706 |
| 6,265,771 | B1 * | 7/2001 | Ference et al. .............. 257/706 |
| 7,573,131 | B2 * | 8/2009 | Cui et al. .................... 257/707 |
| 2006/0131735 | A1 * | 6/2006 | Ong et al. ................... 257/706 |

* cited by examiner

*Primary Examiner*—Douglas M Menz

(57) ABSTRACT

The invention discloses an integrated circuit package. The integrated circuit package comprises a substrate having a first surface and a second surface opposite thereto and a first hole passing through the substrate from the first surface to the second surface. A plurality of conductive lines is disposed on a portion of the second surface of the substrate. A semiconductor chip is disposed above the second surface of the substrate, wherein a chamber is formed between the semiconductor chip and the substrate. A plurality of bonding pads are disposed on a side of the semiconductor chip which is toward the second surface of the substrate, wherein at least one of the bonding pads are electrically connected to one of the plurality of conductive lines. A first heat dissipation layer is disposed in the first hole, and extends into the chamber. A method for fabricating the integrated circuit package is also provided.

11 Claims, 11 Drawing Sheets

INTEGRATED CIRCUIT PACKAGE AND FABRICATING METHOD THEREOF

This application is a divisional of U.S. application Ser. No. 12/102,439, filed Apr. 14, 2008, the entire disclosure of which is hereby incorporated by reference.

BACKGROUND OF THE INVENTION

1. Field of the Invention

The present invention relates to an integrated circuit (IC) package, and more particularly relates to a method for manufacturing the integrated circuit (IC) package.

2. Description of the Related Art

In the semiconductor industry, integrated circuits are typically formed on wafers, wherein a plurality of semiconductor chips on same wafer is formed simultaneously. The semiconductor chips are then sawed from the wafers. Since semiconductor chips are typically small and fragile, they need to be packaged before used.

FIG. 1 illustrates a conventional integrated circuit (IC) package, which includes a semiconductor chip 12. First, the semiconductor chip 12 is bonded to a package substrate 10, for example, through an adhesive layer 14. Then, balls 16 are formed on the package substrate 10 to connect the package substrate 10 to the other electrical components, such as a motherboard. Finally, a resin 20 is filled to cover the semiconductor chip 12. Since the resin 20 and the package substrate 10 are not good heat dissipation materials, the heat from the semiconductor chip 12 is localized within the IC package. Thus, resulting in a relatively shorter operating lifespan of the semiconductor chip 12 or abnormal functioning of the semiconductor chip 12.

Therefore, new packaging structures and methods are needed.

BRIEF SUMMARY OF THE INVENTION

A detailed description is given in the following embodiments with reference to the accompanying drawings. An integrated process for fabricating various thicknesses of gate dielectric layers in a memory device with a recessed gate is provided.

One embodiment of the invention discloses an integrated circuit package. The integrated circuit package includes a substrate having a first surface and a second surface opposite thereto and a first hole passing through the substrate from the first surface to the second surface. A plurality of conductive lines is disposed on a portion of the second surface of the substrate. A semiconductor chip is disposed above the second surface of the substrate, wherein a chamber is formed between the semiconductor chip and the substrate. A plurality of bonding pads are disposed on a side of the semiconductor chip which is toward the second surface of the substrate, wherein at least one of the bonding pads are electrically connected to one of the plurality of conductive lines. A first heat dissipation layer is disposed in the first hole, and extends into the chamber.

Another embodiment of the invention discloses a method for forming an integrated circuit package. The integrated circuit package includes providing a substrate having a first surface and a second surface opposite thereto and a first hole passing through the substrate from the first surface to the second surface. A first heat dissipation layer is formed on the first surface. A plurality of conductive lines is formed on a portion of the second surface. A semiconductor chip is provided over the second surface of the substrate, wherein a chamber is formed between the semiconductor chip and the substrate. A plurality of bonding pads is formed on a side of the semiconductor chip which is toward the second surface of the substrate, wherein at least one of the bonding pads are electrically connected to one of the conductive lines. A second heat dissipation layer is formed in the first hole, and extends into the chamber, wherein the second heat dissipation layer is contacted to the first heat dissipation layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

As shown in FIGS. 2A-2E, the cross sections show fabrication steps of an IC package according to an embodiment of the invention.

Figure 1:
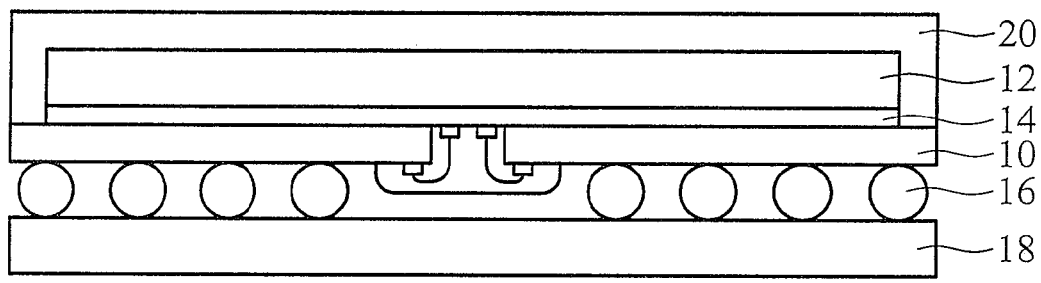
FIG. 1 illustrates a cross-sectional view of a conventional integrated circuit package.
Figure 2A:
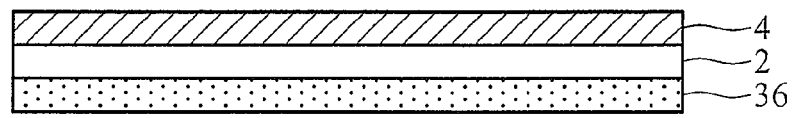
FIG. 2A through FIG. 2F are cross sections of a method for forming an integrated circuit package according to an embodiment of the invention, illustrating fabrication steps thereof.

FIG. 2A shows the initial step of forming an IC package of a preferred embodiment of the invention. A substrate 2 is provided and is preferably a polyimide substrate. Then the conductive layers 4 and 36 are formed on the substrate 2, respectively. The conductive layers 4 and 36 may comprise of any commonly used conductive materials. In an embodiment of the invention, the conductive layers 4 and 36 include copper or copper alloys, although other metals, such as gold, aluminum and silver may also be used. In one embodiment of the invention, the conductive layers 4 and 36 can be respectively formed on the upper and lower surfaces of the substrate 2 by a process, such as an attaching or adhesion process. Also an electroplating process can be used to form the conductive layers 4 and 36 on the upper surface and the lower surface of the substrate 2, respectively. In another embodiment of the invention, an insulation layer is coated on a first conductive layer. After the insulation layer is solidified, a substrate is formed. Then a second conductive layer (not shown) is formed on another side of the substrate by a process, such as an electroplating, electroforming, attaching or adhesion process. It is noted that the material of the conductive layer 4 and the material of the conductive layer 36 can be the same or different.

Figure 2B:
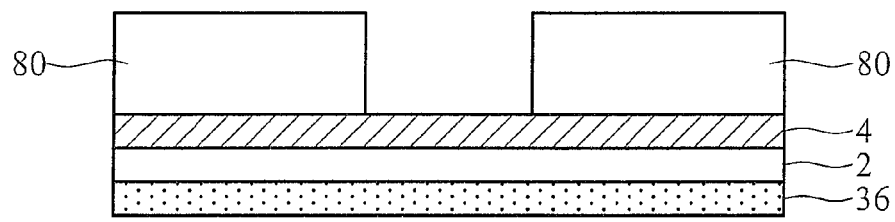

Referring to FIG. 2B, a patterned photoresist layer 80 is formed over the conductive layer 4 of the upper surface of the substrate 2 as an etching mask.

Figure 2C:
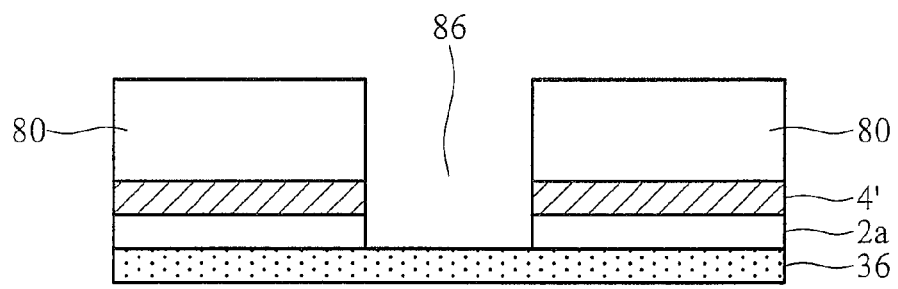

Referring to FIG. 2C, portions of the substrate 2 and the conductive layer 4 are removed by processes, such as a laser drilling process, etching process or both. Thus, an opening 86 is formed and a portion of the conductive layer 36 is exposed from the bottom of the opening 86. The conductive layer 36 which is disposed on the lower surface of the substrate 2a can be a first heat dissipation layer.

Figure 2D:
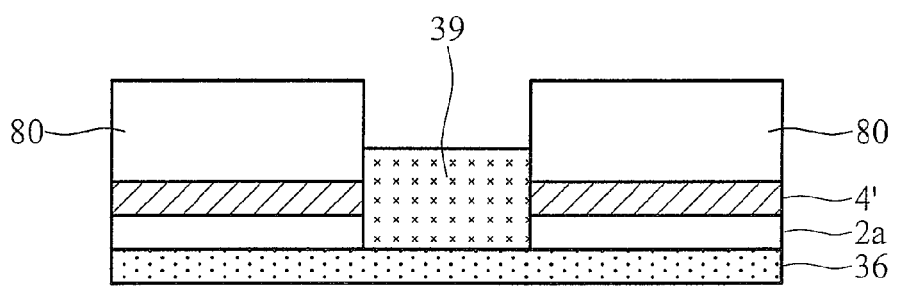

Referring to FIG. 2D, a second heat dissipation layer 39 is formed in the opening 86, wherein the height of the second heat dissipation layer 39 is higher than the height of the conductive layer 4. In this embodiment of the invention, the second heat dissipation layer 39 can be formed by a process, such as an electroplating, electroforming, physical vapor deposition (PVD) or chemical vapor deposition (CVD) process.

Figure 2E:
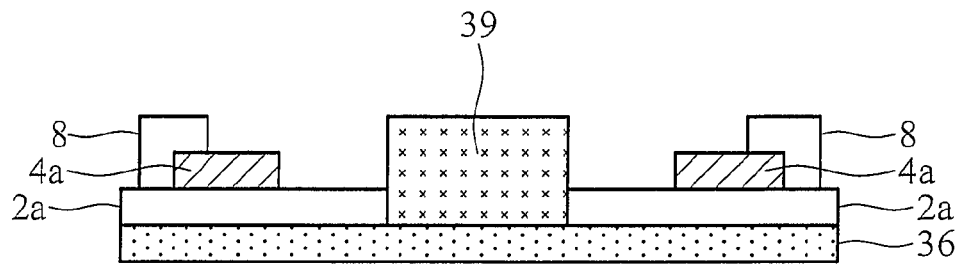

Referring to FIG. 2E, after removing the patterned photoresist layer 80, a conventional photolithography and etching process are used to pattern the conductive layer 4 to form a plurality of conductive lines 4a. Generally, the steps of patterning the conductive layer 4 include, first, forming a patterned photoresist layer (not shown) on the conductive layer 4. Then, an etching process is performed in order to remove the conductive layer 4 not covered by the patterned photoresist layer, wherein the remaining portions of the conductive layer 4 form a plurality of the conductive lines 4a. Next, insulation layer 8 is formed on the outside of the conductive lines 4a by a printing process, such as a screen printing process, for protecting the conductive lines 4a. In this embodiment of the invention, the insulation layer 8 is made of epoxy resin.

Figure 2F:
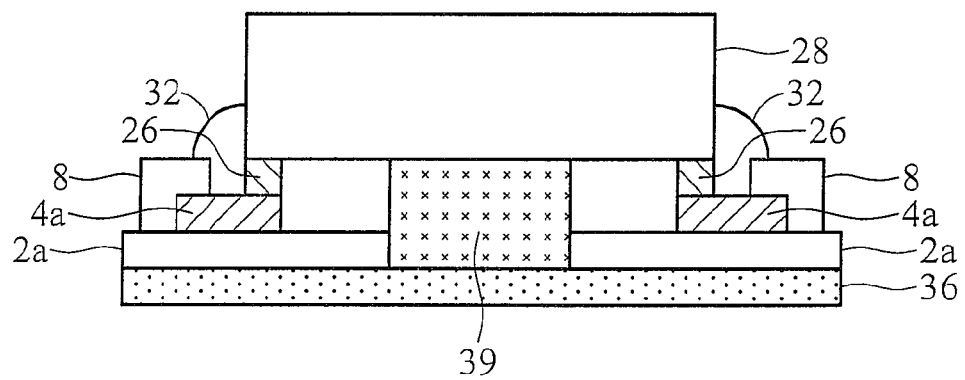

As FIG. 2F shows, a semiconductor chip 28 is provided and is disposed over the upper surface of the substrate 2, thus a chamber is formed between the semiconductor chip 28 and the substrate 2. A plurality of bonding pads 26 are then formed on a side of the semiconductor chip 28 which is toward the upper surface of the substrate 2, and at least one of the bonding pads 26 are electrically connected with one of the conductive lines 4a. In an embodiment of the invention, the bonding pads 26 can be formed by processes, such as an electroplating, electroforming, physical vapor deposition (PVD), or chemical vapor deposition (CVD) process or combinations thereof. The conductive layer 36 and the second heat dissipation layer 39 can constitute a heat dissipation layer. Therefore, allowing the heat of the semiconductor chip 28 to be dissipated to the outside of the IC package, wherein the second heat dissipation layer 39 is extended to the chamber from the conductive layer 36 of the bottom of the opening 86 and is contacted to the semiconductor chip 28.

Following, the semiconductor chip 28 having a plurality of bonding pads 26 is bonded to the substrate 2a and at least one of the bonding pads 26 are electrically connected to one of the conductive lines 4a. Finally, a resin 32 is filled into the chamber in order to seal the second heat dissipation layer 39 which is between the semiconductor chip 28 and the substrate 2a.

Figure 2G:
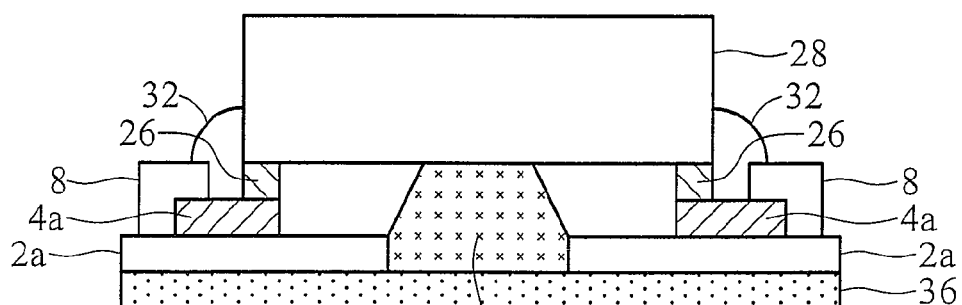
FIG. 2G illustrates a cross-sectional view of an integrated circuit package in accordance with an embodiment of the invention.

Referring to FIG. 2G, another embodiment of the invention is shown. A heat dissipation layer 84 is formed on the conductive layer 36 of the bottom of the opening 86 and is extended into the chamber by shortening the process time of the electroplating process or by designing a special mask pattern, wherein the heat dissipation layer 84 is contacted to the semiconductor chip 28. It should be noted that the contact area between the heat dissipation layer 84 and the semiconductor chip 28 is smaller than the contact area between the second heat dissipation layer 39 and the semiconductor chip 28 in FIG. 2F. Therefore, saving manufacturing costs.

FIG. 3A through FIG. 3E are cross sections of a method for forming an integrated circuit package according to another embodiment of the invention, illustrating fabrication steps thereof.

Figure 3A:
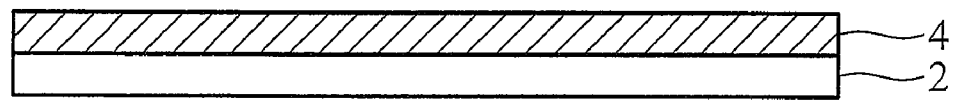
FIG. 3A through FIG. 3E are cross sections of a method for forming an integrated circuit package according to an embodiment of the invention, illustrating fabrication steps thereof.

FIG. 3A shows the initial step of forming an IC package of another embodiment of the invention. A substrate 2 is provided and is preferably a polyimide substrate. Then a conductive layer 4 is formed on the substrate 2. The conductive layer 4 may comprise of any commonly used conductive materials. In an embodiment of the invention, the conductive layer 4 includes copper or copper alloys, although other metals, such as gold, aluminum and silver may also be used. In this embodiment of the invention, the conductive layer 4 can be formed by processes, such as an electroplating, electroforming, physical vapor deposition (PVD) or chemical vapor deposition (CVD) process or combinations thereof.

Figure 3B:

Referring to FIG. 3B, a conventional photolithography and etching process are used to pattern the conductive layer 4 to form a plurality of conductive lines 4a.

Figure 3C:
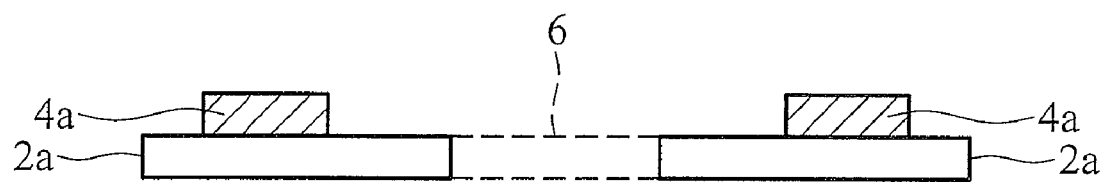

Referring to FIG. 3C, at least one of a hole 6 is formed in the substrate 2 and passes through the substrate 2, by processes, such as a laser drilling or etching process or combinations thereof. Thus, forming a substrate 2a.

Figure 3D:
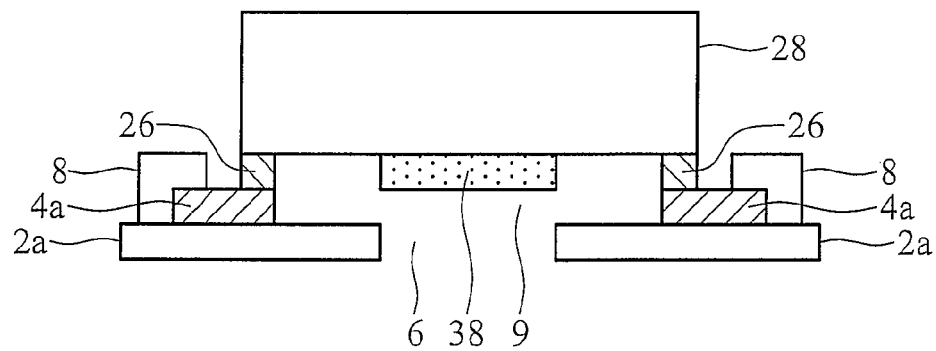

As FIG. 3D shows, the semiconductor chip 28 having a plurality of bonding pads 26 and a first heat dissipation layer 38 is bonded to the substrate 2a, and at least one of the bonding pads 26 are electrically connected with one of the conductive lines 4a. Therefore, a chamber 9 is formed between the semiconductor chip 28 and the substrate 2a. In an embodiment of the invention, the bonding pads 26 may be formed by processes, such as a physical vapor deposition (PVD), chemical vapor deposition (CVD), electroplating or electroforming process or combinations thereof. Next, insulation layer 8 is formed on the outside of the conductive lines 4a by a printing process, such as a screen printing process, for protecting the conductive lines 4a.

Figure 3E:
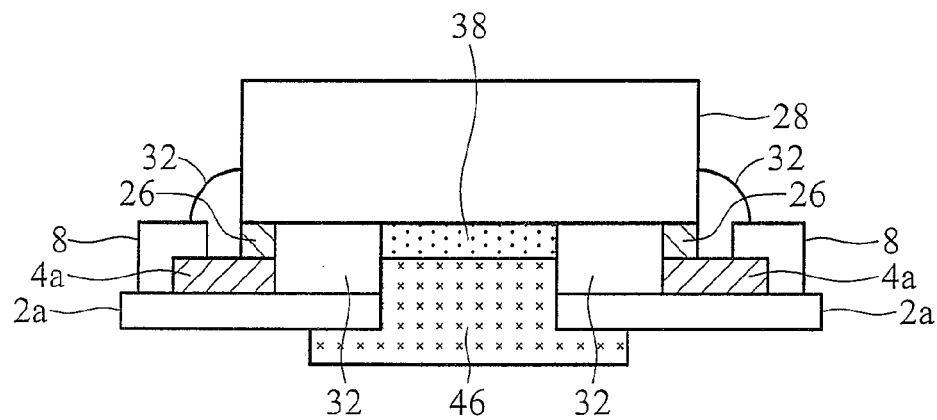

Referring to FIG. 3E, a second heat dissipation layer 46 having protrusions is aligned with the hole 6 by using precision alignment and is attached to the substrate 2a and the semiconductor chip 28. Next, the chamber 9 is filled with a resin 32 for sealing the first heat dissipation layer 38 and the second heat dissipation layer 46 between the semiconductor chip 28 and the substrate 2a.

Figure 3F:
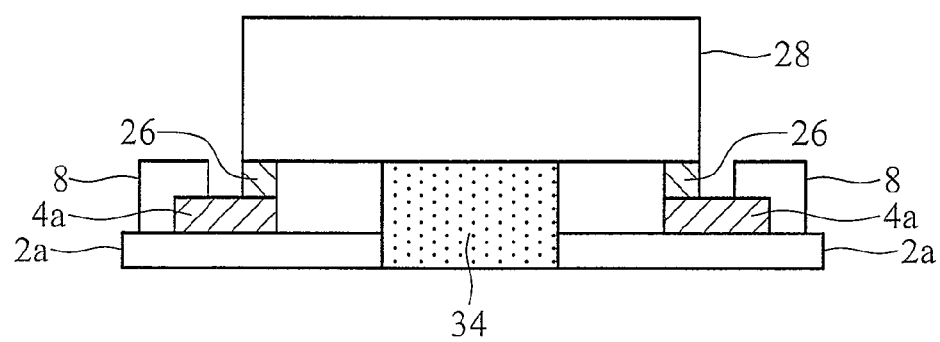
FIG. 3F illustrates a cross-sectional view of an integrated circuit package in accordance with an embodiment of the invention.

Continuing to FIG. 3D and referring to FIG. 3F, in another embodiment of the invention, a first heat dissipation layer 34 is formed which is thicker than the first heat dissipation layer 38 on the semiconductor chip 28 by increasing the process time of an electroplating process, wherein the first heat dissipation layer 34 passes through the chamber 9 and the hole 6 and is directly exposed to the air for providing effective heat dissipation. It is noted that the first heat dissipation layer 38 is only formed in the hole 6 and the chamber 9 and is not formed to ,the lower surface of the substrate 2a. Compared to the embodiment of FIG. 2F, since the manufacturing method of the IC package of this embodiment of the invention uses a circuit board substrate having a single-layer conductive material, the manufacturing cost of this embodiment of the invention is lower than that of the embodiment of FIG. 2F, which uses a circuit board substrate having a double-layer conductive material.

FIGS. 4A to 4D show cross sections of a manufacturing method of an IC package according to a preferred embodiment of the invention.

Figure 4A:
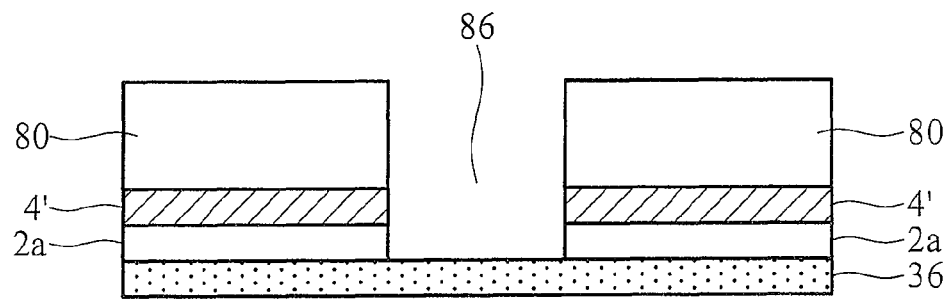
FIG. 4A through FIG. 4D are cross sections of a method for forming an integrated circuit package according to an embodiment of the invention, illustrating fabrication steps thereof.

Referring to FIG. 4A, a device is provided which is the same as the device of FIG. 2C. The details for forming the device of FIG. 4A is similar to the manufacturing method of FIG. 2A to FIG. 2C, thus are not repeated herein.

Figure 4B:
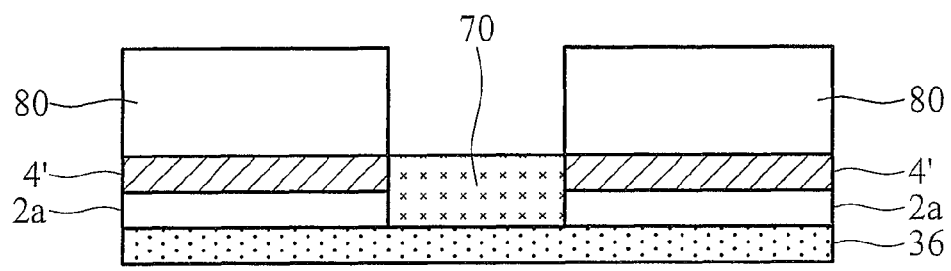

Referring to FIG. 4B, a second heat dissipation layer 70 is formed in the opening 86 and the height of the second heat dissipation layer 70 is substantially the same as the height of conductive layer 4'. In this embodiment of the invention, the second heat dissipation layer 70 may be formed by a process, such as an electroplating, electroforming, physical vapor deposition (PVD) or chemical vapor deposition (CVD) process.

Figure 4C:
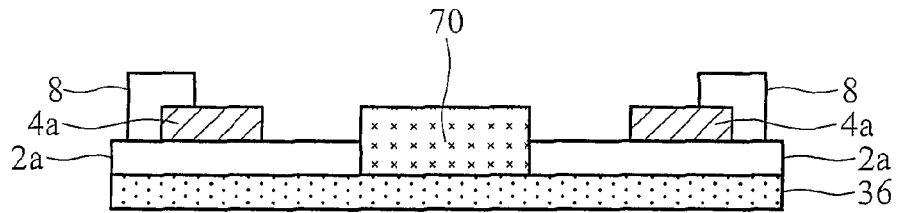

Referring to FIG. 4C, after removing the patterned photoresist layer 80, a conventional photolithography and etching process are used to pattern the conductive layer 4' to form a plurality of conductive lines 4a.

Figure 4D:
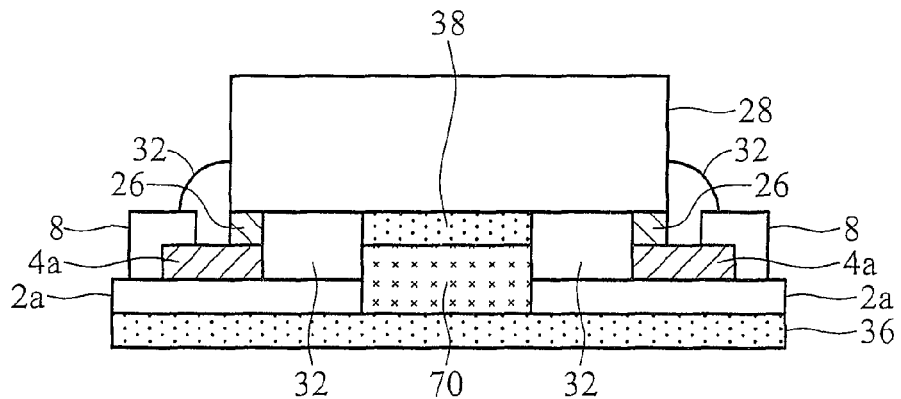

As FIG. 4D shows, a semiconductor chip 28 is provided and is disposed over the upper surface of the substrate 2a. The semiconductor chip 28 and the substrate 2a may be bonded by an adhesive material, wherein the first heat dissipation layer 38 is contacted to the second heat dissipation layer 70. In addition, at least one of the bonding pads 26 are electrically connected to one of the conductive lines 4a. Next, insulation layer 8 is formed on the outside of the conductive lines 4a by a printing process, such as a screen printing process, for protecting conductive lines 4a. Finally, the chamber is filled with a resin 32 for sealing the first heat dissipation layer 38 and the second heat dissipation layer 70 between the semiconductor chip 28 and the substrate 2a. Thus, when the semiconductor chip 28 is operated, the heat produced from the semiconductor chip 28 is passed to the outside of the IC package through the first heat dissipation layer 38, the second heat dissipation layer 70 and the conductive layer 36.

Figure 4E:
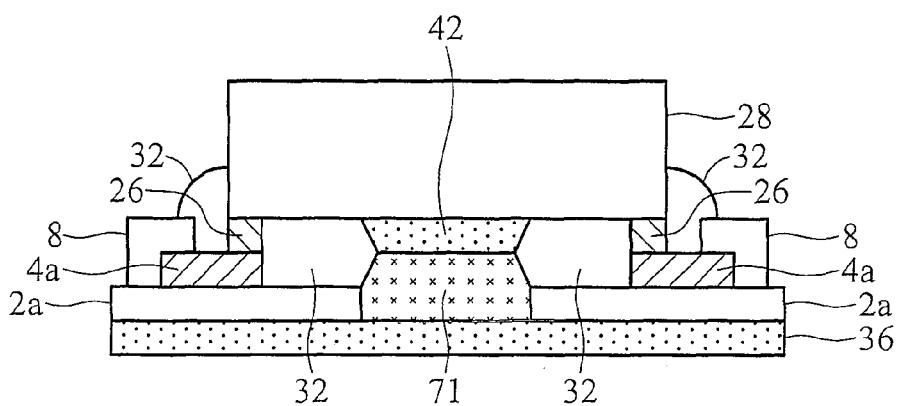
FIG. 4E illustrates a cross-sectional view of an integrated circuit package in accordance with an embodiment of the invention.

Referring to FIG. 4E, another embodiment of the invention is shown. A heat dissipation layer 42 is formed on the semiconductor chip 28 by shortening the process time of the electroplating, electroforming, PVD or CVD process or by designing a special mask pattern. It is noted that the area of the heat dissipation layer 42 is smaller than the area of the first heat dissipation layer 38, thus the manufacturing cost of this embodiment of the invention is lower then the manufacturing cost of the embodiment of FIG. 4D. Similarly, a second heat dissipation layer 71 maybe formed by shortening the process time of the electroplating process instead of the second heat dissipation layer 70 on the conductive layer 36 in the embodiment of FIG. 4D. Since the area of the heat dissipation layer 71 is smaller than the area of the second heat dissipation layer 70, manufacturing costs are further reduced.

Figure 5A:
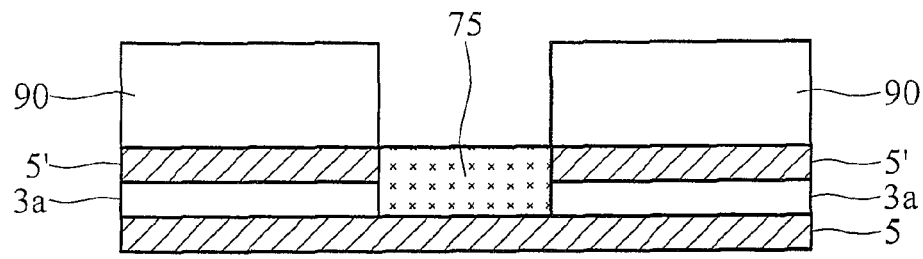
FIG. 5A through FIG. 5C are cross sections of a method for forming an integrated circuit package according to an embodiment of the invention, illustrating fabrication steps thereof.
Figure 5B:
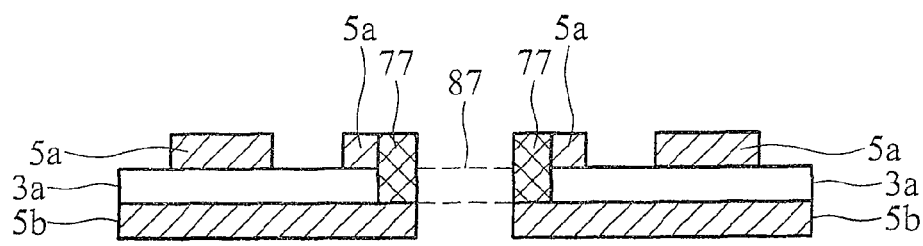
Figure 5C:
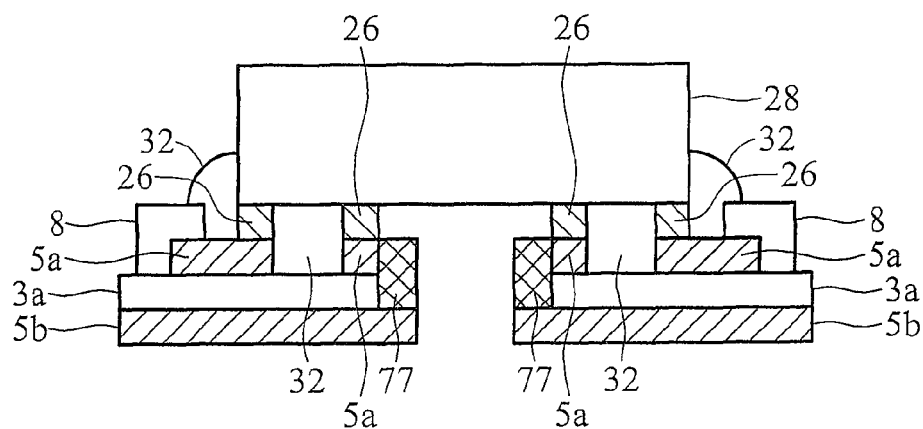

FIG. 5A through FIG. 5C are cross sections of a method for forming an integrated circuit package according to another embodiment of the invention, illustrating fabrication steps thereof.

Referring to FIG. 5A, a device is provided which is the same as the device of FIG. 4B, which may be formed essentially the same materials and use essentially the same methods as the device of FIG. 2A to FIG. 2C and FIG. 4B. In this embodiment of the invention, the height of a second heat dissipation layer 75 on a conductive layer 5 and the height of a conductive layer 5' on a substrate 3a are the same. The conductive layer 5 can be a first heat dissipation layer.

Referring to FIG. 5B, after removing the patterned photoresist layer 90, a conventional photolithography and etching process are used to pattern the conductive layer 5' to form conductive lines 5a. Following, portions of the second heat dissipation layer 75 and the conductive layer 5 are removed by a process; such as a laser drilling or etching process for forming an opening 87, a conductive layer 5b and a plurality of separated second heat dissipation layers which are connected to the conductive lines 5a and the conductive layer 5b.

As FIG. 5C shows, the semiconductor chip 28 having a plurality of bonding pads 26 are bonded to the substrate 3a, thus a chamber is formed between the semiconductor chip 28 and the substrate 3a. In this embodiment of the invention, at least one of the bonding pads 26 are electrically connected with one of the conductive lines 5a. Similarly, the bonding pads 26 may be formed by processes, such as a physical vapor deposition (PVD), chemical vapor deposition (CVD), electroplating, or electroforming process or combinations thereof. Next, insulation layer 8 is formed on the outside of the conductive lines 5a by a printing process, such as a screen printing process, for protecting conductive lines 5a. Eventually, a resin 32 is filled into the chamber for sealing the conductive lines 5a between the semiconductor chip 28 and the substrate 3a.

Figure 5D:
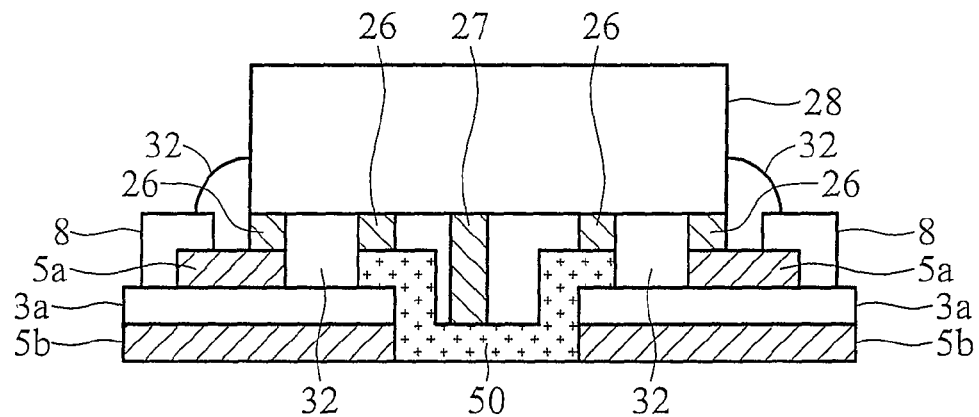
FIG. 5D illustrates a cross-sectional view of an integrated circuit package in accordance with an embodiment of the invention.

Referring to FIG. 5D, in an embodiment of the invention, a heat dissipation layer 50 passes through a hole from the conductive layer 5b of the lower surface of the substrate 3a and then extends to the upper surface of the substrate 3a to completely cover the hole. The difference between this embodiment of the invention and the embodiment of FIG. 4E is that the heat dissipation layer 50 is connected with the bonding pads 26 and the bonding pads 27, which is formed on the semiconductor chip 28. Therefore, this embodiment of the invention can increase heat dissipation efficiency when compared with the embodiment of FIG. 4E. In this embodiment of the invention, the length of the bonding pads 27 is longer than the length of bonding pads 26, and the bonding pads 27 are formed by using essentially same methods as the bonding pads 26. Further, the bonding pads 27 are next to the bonding pads 26.

Figure 5E:
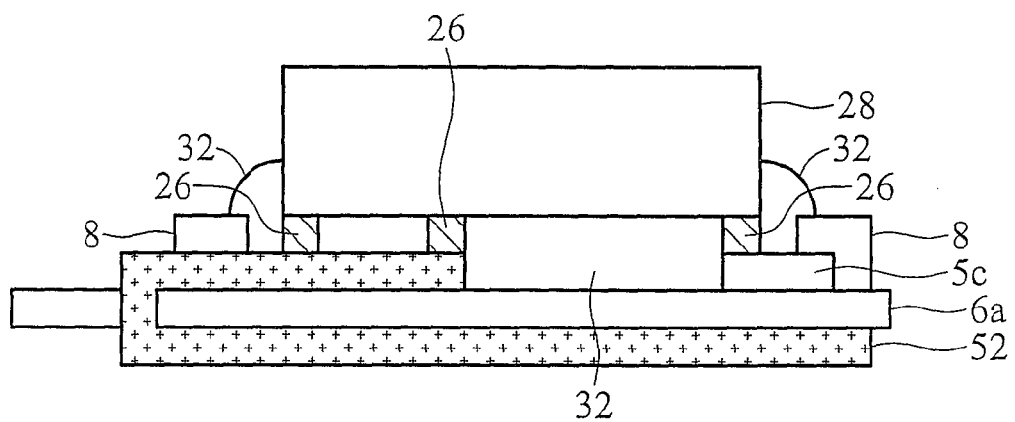
FIG. 5E illustrates a cross-sectional view of an integrated circuit package in accordance with an embodiment of the invention.

In another embodiment of the invention as FIG. 5E shows, a heat dissipation layer 52 passes through a hole on the outside of the semiconductor chip 28 from the lower surface of the substrate 3a, and extends to the upper surface of the substrate 3a and contacts with the bonding pads 26 on the semiconductor chip 28. Therefore, the heat from the semiconductor chip 28 can pass to the outside of IC package by the heat dissipation layer 52.

As shown in FIGS. 6-10, the cross sections show fabrication steps of IC packages according to other embodiments.

Figure 6:
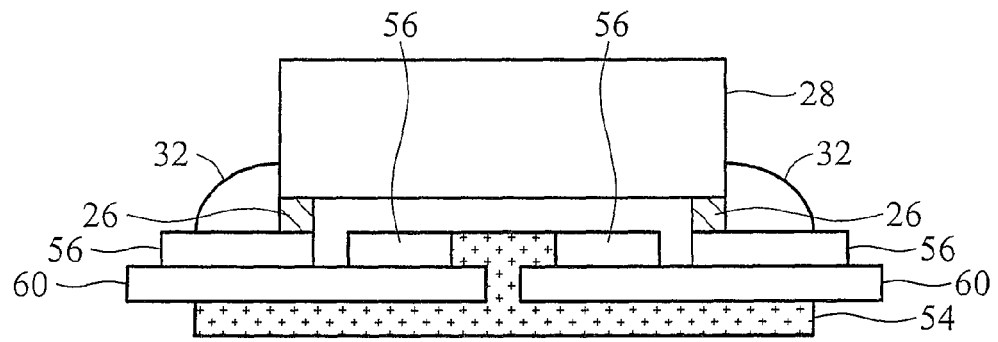
FIG. 6 illustrates a cross-sectional view of an integrated circuit package in accordance with an embodiment of the invention.

Referring to FIG. 6, a heat dissipation layer 54 passes through a hole from the lower surface of the substrate 60 and extends to the upper surface of the substrate 60, and then contacts to the conductive line 56 of the upper surface of the substrate 60. Since the heat dissipation layer 54 is spaced at a specific interval from the bonding pads 26 and the semiconductor chip 28, the heat generated by operation of the semiconductor chip 28 is sequentially passed to the outside of IC package through the resin 32 and the heat dissipation layer 54.

Figure 7:
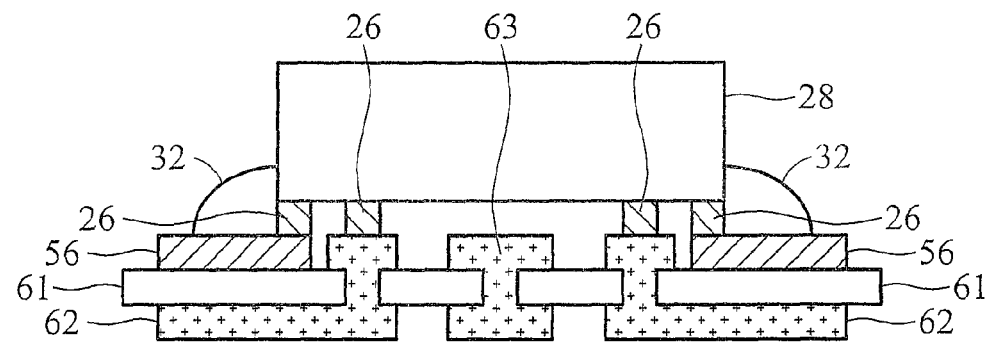
FIG. 7 illustrates a cross-sectional view of an integrated circuit package in accordance with an embodiment of the invention.

As FIG. 7 shows, in another embodiment of the invention, a first heat dissipation layer 62 and a nearby second heat dissipation layer 63 are formed on a substrate 61 having a plurality of holes, wherein the holes are respectively filled. The first heat dissipation layer 62 is connected to the bonding pads 26 whereas the second heat dissipation layer 63 is spaced at a specific interval from the bonding pads 26 and the semiconductor chip 28. In this embodiment of the invention, since the first heat dissipation layer 62 is connected to the bonding pads 26, this embodiment of the invention can increase heat dissipation efficiency of the IC package when compared with the embodiment of FIG. 6.

Figure 8:
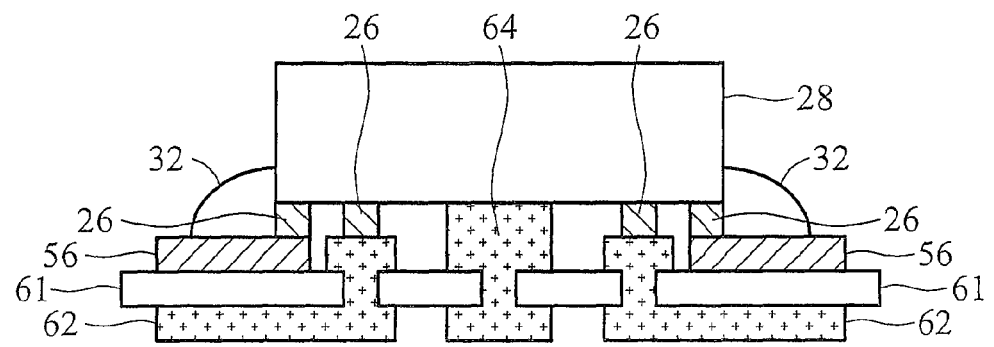
FIG. 8 illustrates a cross-sectional view of an integrated circuit package in accordance with an embodiment of the invention.

As FIG. 8 shows, in a preferred embodiment of the invention, the second heat dissipation layer 63 of the embodiment of FIG. 7 is extended from the chamber 9 to the semiconductor chip 28 by increasing the process time of the electroplating process for forming a third heat dissipation layer 64. Therefore, the heat dissipation efficiency of the IC package is relatively increased.

Figure 9:
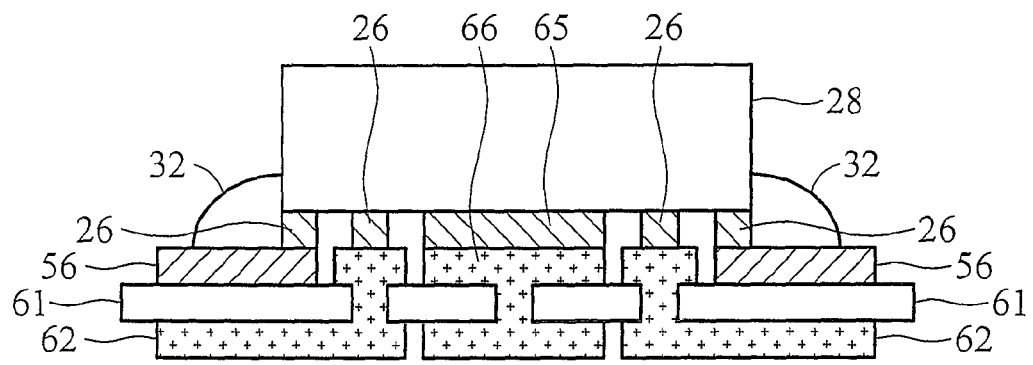
FIG. 9 illustrates a cross-sectional view of an integrated circuit package in accordance with an embodiment of the invention.

Referring to FIG. 9, in an embodiment of the invention, the first heat dissipation layer 62 and the second heat dissipation layer 66 are respectively connected to the bonding pads 26 and the third heat dissipation layer 65. The third heat dissipation layer 65 is formed on the semiconductor chip 28 and is next to the bonding pads 26. Thus, the heat generated by operation of the semiconductor chip 28 passes to the outside of the IC package through the bonding pads 26 with the first heat dissipation layer 62 and through the third heat dissipation layer 65 with the second heat dissipation layer 66, respectively.

Figure 10:
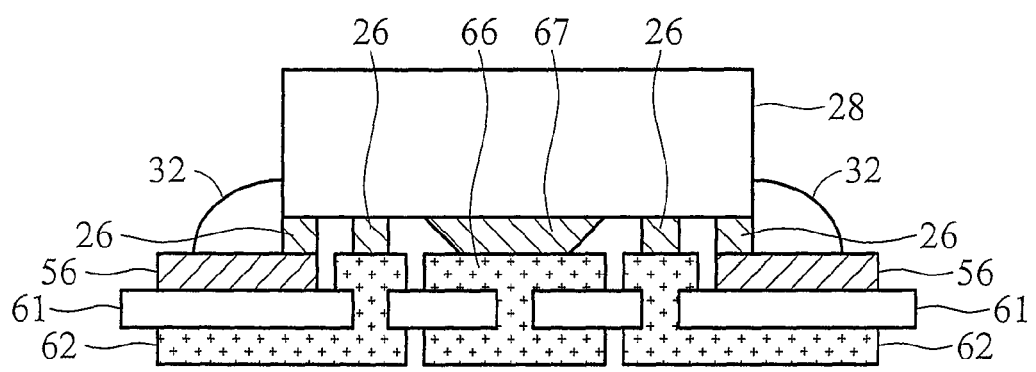
FIG. 10 illustrates a cross-sectional view of an integrated circuit package in accordance with an embodiment of the invention.

Referring to FIG. 10, a heat dissipation layer 67 having an area which is smaller than the area of the third heat dissipation layer 65 is formed by shortening the process time of the electroplating, electroforming, PVD or CVD process or by designing a special mask pattern instead of the third heat dissipation layer 65 of FIG. 9, to save relative manufacturing costs of the IC package.

The above embodiments have several advantageous features. For example, in the embodiments from FIG. 6 to FIG. 10, the semiconductor chip 28 can operate since the electrical signals can be transferred to the substrate 61 by respectively connecting one of the bonding pads 26 with the conductive line 56 and connecting another one of the bonding pads 26 with the first heat dissipation layer 62. Specifically, multi-wiring can be achieved in the same dimensions of the IC package for increasing transmission efficiency of electrical signals when applying the above embodiments. In addition, since the wires can dissipate heat, heat dissipation efficiency of the IC package is increased.

Another advantage of the above. embodiments is that since materials of the heat dissipation layer can be the same as the conductive lines of the substrate, costs of additional materials are not necessary for improving the heat dissipation efficiency of the IC package.

While the present invention has been particularly shown and described with reference to preferred embodiments thereof, it will be understood by those of ordinary skill in the art that various changes in faun and details may be made therein without departing from the spirit and scope of the present invention as defined by the following claims.

What is claimed is:

1. A method for forming an integrated circuit package comprising:
    providing a substrate having a first surface and a second surface opposite thereto;
    forming a first conductive layer on the first surface of the substrate, acting as a first heat dissipation layer;
    forming a second conductive layer on the second surface of the substrate;
    selectively etching the second conductive layer and the substrate to form a first opening through the second conductive layer and the substrate;
    forming a second heat dissipation layer in the opening;
    patterning the second conductive layer to form a plurality of conductive lines on a portion of the second surface;
    providing a semiconductor chip above the second surface of the substrate, wherein a chamber is formed between the semiconductor chip and the substrate; and
    forming a plurality of bonding pads on a side of the semiconductor chip which is toward the second surface of the substrate, wherein at least one of the bonding pads are electrically connected to one of the conductive lines.

2. The method for forming an integrated circuit package as claimed in claim 1, wherein the second heat dissipation layer is contacted to the semiconductor chip.

3. The method for forming an integrated circuit package as claimed in claim 1, further comprising forming a third heat dissipation layer on a side of the semiconductor chip which is toward the second surface of the substrate, and the third heat dissipation layer is connected to the second heat dissipation layer and the semiconductor chip.

4. The method for forming an integrated circuit package as claimed in claim 1, wherein the second heat dissipation layer extends to the conductive lines of the substrate.

5. The method for forming an integrated circuit package as claimed in claim 1, wherein the second heat dissipation layer is spaced at a predetermined distance from the semiconductor chip and the bonding pads.

6. The method for forming an integrated circuit package as claimed in claim 1, further comprising filling the chamber with a resin for sealing the second heat dissipation layer between the semiconductor chip and the substrate.

7. The method for forming an integrated circuit package as claimed in claim 1, wherein the second heat dissipation layer is made of gold, silver or copper.

8. The method for forming an integrated circuit package as claimed in claim 1, further comprising patterning the second heat dissipation layer and the first conductive layer to form a second opening.

9. The method for forming an integrated circuit package as claimed in claim 8, wherein the second heat dissipation layer is partitioned into separated elements by formation of the second opening.

10. The method for forming an integrated circuit package as claimed in claim 1, wherein at least one of the bonding pads are formed to directly contact the second heat dissipation layer.

11. The method for forming an integrated circuit package as claimed in claim 1, wherein the substrate is a polyimide substrate.

* * * * *